United States Patent
Tsujisawa et al.

(10) Patent No.: US 8,836,919 B2
(45) Date of Patent: Sep. 16, 2014

(54) MANAGEMENT METHOD AND SYSTEM FOR EXPOSURE APPARATUS HAVING ALARM BASED ON INCLINATION AMOUNT AND DEVIATION FROM ALIGNED POSITION

(75) Inventors: Kenichi Tsujisawa, Mie-ken (JP); Hiroshi Matsushita, Mie-ken (JP); Takayoshi Otake, Mie-ken (JP); Hideyuki Oishi, Mie-ken (JP); Akira Ogawa, Mie-ken (JP); Koji Washiyama, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 509 days.

(21) Appl. No.: 13/194,322

(22) Filed: Jul. 29, 2011

(65) Prior Publication Data

US 2012/0028192 A1    Feb. 2, 2012

(30) Foreign Application Priority Data

Jul. 30, 2010    (JP) .................... 2010-172000

(51) Int. Cl.
  *G03F 7/20* (2006.01)
  *G03F 9/00* (2006.01)

(52) U.S. Cl.
  CPC .......... *G03F 9/7007* (2013.01); *G03F 7/70533* (2013.01)

USPC .............................................. 355/77; 700/121

(58) Field of Classification Search
  CPC ............ G03F 7/70483; G03F 7/70491; G03F 7/70508; G03F 7/70525; G03F 7/70533; G03F 7/70616; G03F 7/70633; G03F 7/70775
  See application file for complete search history.

(56) References Cited

U.S. PATENT DOCUMENTS

| | | | |
|---|---|---|---|
| 7,742,834 B2 | 6/2010 | Matsushita et al. | |
| 7,970,486 B2 | 6/2011 | Matsushita et al. | |
| 2004/0167640 A1* | 8/2004 | Knappe et al. | 700/57 |
| 2010/0060470 A1 | 3/2010 | Matsushita | |

* cited by examiner

*Primary Examiner* — Peter B Kim
*Assistant Examiner* — Michelle Iacoletti
(74) *Attorney, Agent, or Firm* — Oblon, Spivak, McClelland, Maier & Neustadt, L.L.P.

(57) ABSTRACT

According to one embodiment, a control method for an exposure apparatus is disclosed. The method can include retrieving, from a database, a correction amount of alignment correction at a time of exposure of a wafer and an inclination amount of a wafer stage with respect to an optical axis of an exposure optical system at the time of exposure. The method can include making a determination on the inclination amount based on a predetermined condition. The method can include making a determination on the correction amount based on the predetermined condition. In addition, the method can include issuing an alarm when the inclination amount and the correction amount both satisfy the condition.

20 Claims, 6 Drawing Sheets

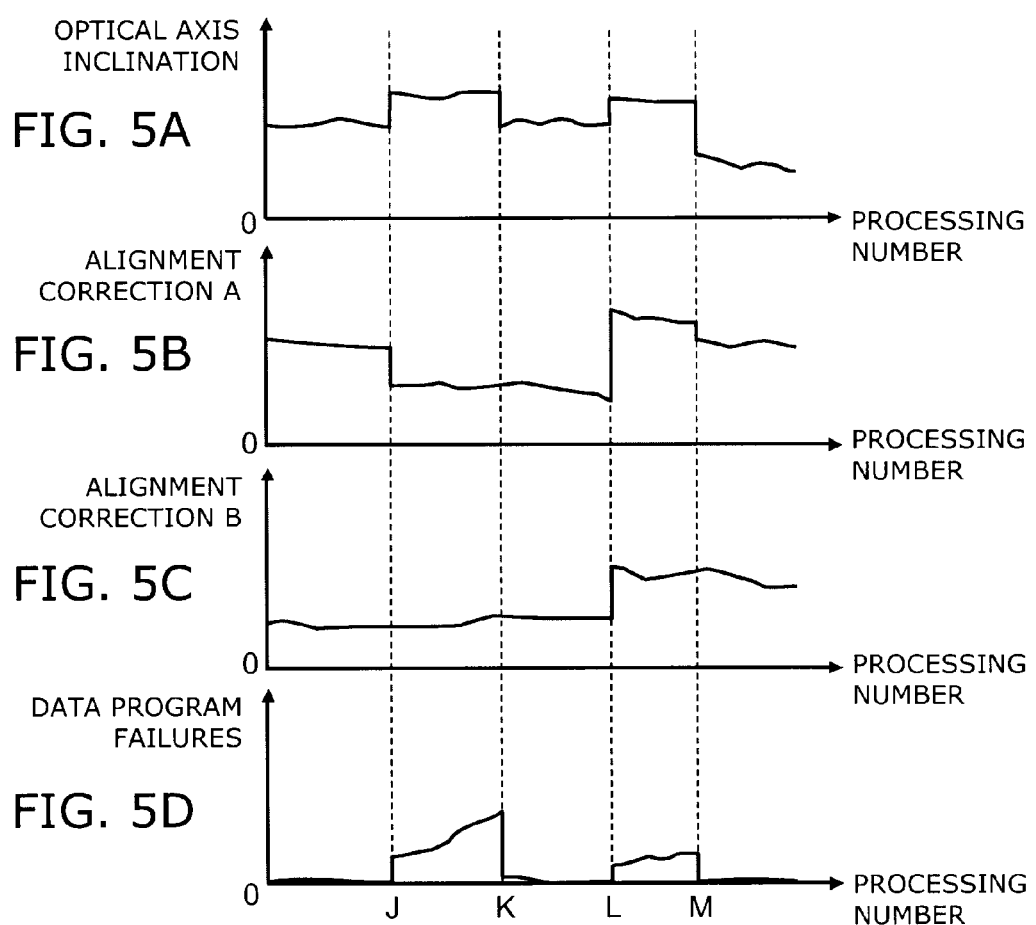

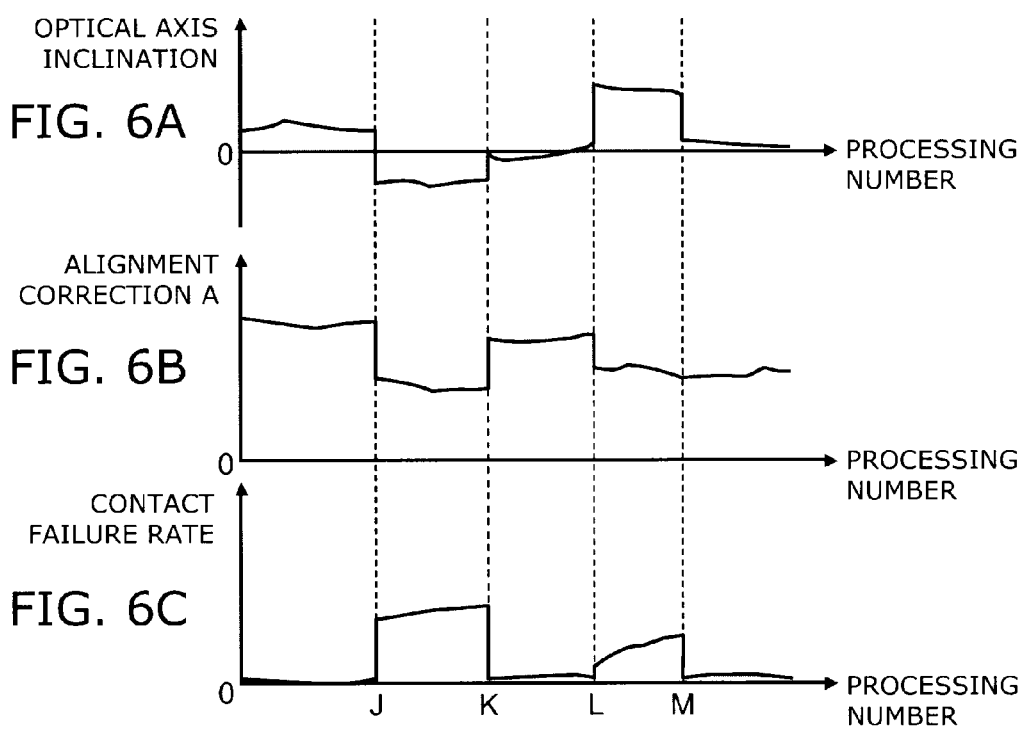

MANAGEMENT METHOD AND SYSTEM FOR EXPOSURE APPARATUS HAVING ALARM BASED ON INCLINATION AMOUNT AND DEVIATION FROM ALIGNED POSITION

CROSS-REFERENCE TO RELATED APPLICATIONS

This application is based upon and claims the benefit of priority from the prior Japanese Patent Application No. 2010-172000, filed on Jul. 30, 2010; the entire contents of which are incorporated herein by reference.

FIELD

Embodiments described herein relate generally to a control method and a control system for exposure apparatus.

BACKGROUND

The process for manufacturing a semiconductor device includes the process of photolithography for forming a prescribed pattern on the surface of a wafer. Photolithography is an important process influencing the quality of the semiconductor device. A central role in photolithography is played by an exposure apparatus. To control the exposure apparatus, the wafer after exposure processing is subjected to dimensional inspection, alignment inspection, or front/back surface inspection.

However, even if no abnormality is found in these inspections, quality trouble due to a malfunction in the exposure apparatus is detected in some cases in the product inspection after completion. In such cases, the exposure processing of wafers is continued during the time from the occurrence of the abnormality of the exposure apparatus to its detection. This may result in producing a large number of defective products. Thus, it is desired that apparatus abnormalities leading to quality trouble be detected with high probability in real time. There is demand for an exposure apparatus control method capable of such detection, and a control system for performing the method.

BRIEF DESCRIPTION OF THE DRAWINGS

FIGS. 5A to 5D are graphs illustrating the variation of the inclination amount of the optical axis, the variation of the correction amount of alignment correction and the variation of the failure rate; and FIGS. 6A to 6C are other graphs illustrating the variation of the inclination amount of the optical axis, the variation of the correction amount of alignment correction and the variation of the failure rate.

DETAILED DESCRIPTION

Figure 1A:
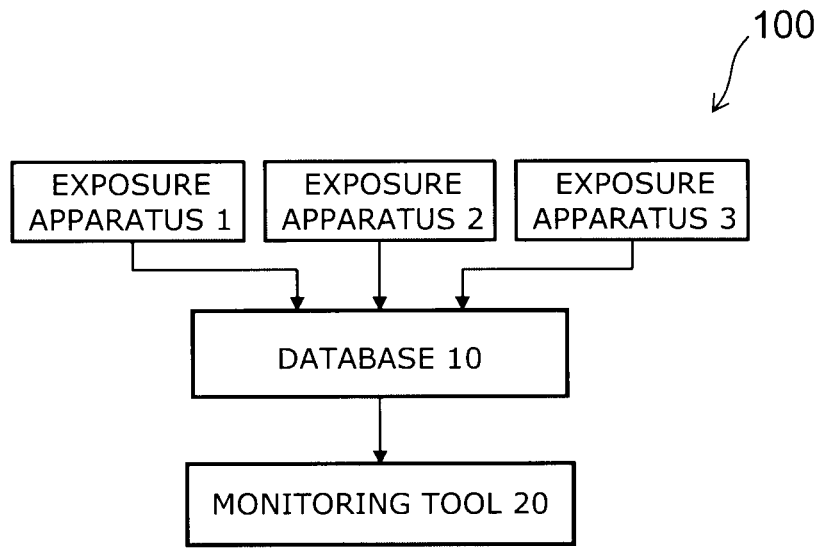
FIGS. 1A and 1B are block diagrams illustrating a control system of an exposure apparatus according to an embodiment.

In general, according to one embodiment, a control method for an exposure apparatus is disclosed. The method can include retrieving, from a database, a correction amount of alignment correction at a time of exposure of a wafer and an inclination amount of a wafer stage with respect to an optical axis of an exposure optical system at the time of exposure. The method can include making a determination on the inclination amount based on a predetermined condition. The method can include making a determination on the correction amount based on the predetermined condition. In addition, the method can include issuing an alarm when the inclination amount and the correction amount both satisfy the condition.

Various embodiments will be described with reference to the accompanying drawings. In the following embodiments, like portions in the figures are labeled with like reference numerals, and the detailed description thereof is omitted as appropriate. The different portions are described as appropriate.

Figure 1B:
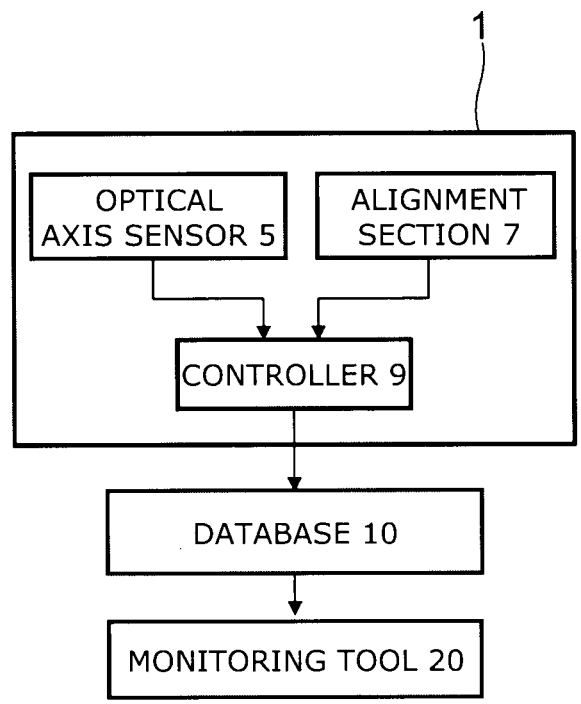

FIGS. 1A and 1B are block diagrams illustrating an exposure apparatus control system 100 according to an embodiment.

FIG. 1A shows the outline of the control system. The exposure apparatus control system 100 according to the embodiment includes e.g. a database 10, and a monitoring tool 20 as a control section.

The database 10 stores correction amounts of alignment correction at the time of exposure of a wafer, and inclination amounts of the optical axis of the exposure optical system with respect to the wafer stage at that exposure time. The correction amounts and the inclination amounts are sent from exposure apparatuses 1 to 3 to the database 10. For instance, the database 10 is a server installed in a factory and functions as an integrated database for storing data from manufacturing apparatuses and testing apparatuses other than the exposure apparatuses 1 to 3.

The monitoring tool 20 is e.g. a terminal connected to the database 10. The monitoring tool 20 reads the correction amount of alignment correction and the inclination amount of the optical axis from the database 10. Based on a predetermined condition, the monitoring tool 20 makes a determination on the correction amount and the inclination amount. When the correction amount and the inclination amount both satisfy the predetermined condition, the monitoring tool 20 issues an alarm.

The data read from the database 10 may be identical to the correction amount and the inclination amount. Alternatively, for instance, relevant data may be read and converted to the correction amount and the inclination amount by the monitoring tool 20.

FIG. 1B illustrates the configuration of the exposure apparatus 1 associated with the control system 100. For instance, the exposure apparatus 1 includes an optical axis sensor 5, an alignment section 7, and a controller 9.

The optical axis sensor 5 senses the inclination of the optical axis of the exposure optical system with respect to the wafer stage for mounting a subject wafer. Here, the inclination of the optical axis refers to the deviation from the optical axis of the exposure optical system preset with respect to the wafer stage. For instance, in an exposure optical system with the optical axis set perpendicular to the wafer stage, the inclination of the optical axis means the deviation of the optical axis with reference to an axis perpendicular to the wafer stage.

The alignment section 7 senses e.g. the position of the alignment mark provided on the subject wafer. Thus, with reference to the alignment mark, the alignment section 7 senses the correction amount of alignment correction as the amount of deviation between the pattern formed on the subject wafer and the exposure pattern.

The correction amount of alignment correction sensed by the alignment section 7 can be sensed as e.g. separate components in the major surface of the wafer stage, such as the X-direction component, Y-direction component, rotational component, orthogonal component, scale component, and shift component for each shot. That is, the correction amount of alignment correction includes linear components in the major surface of the wafer stage, as well as nonlinear components due to e.g. distortion of the exposure optical system. The correction amount for each component is separately sensed.

The controller 9 is e.g. a microprocessor. The controller 9 retrieves the inclination amount of the optical axis from the optical axis sensor 5 and the correction amount of alignment correction from the alignment section 7. The controller 9 adds thereto the information identifying the subject wafer and transmits the result to the database 10.

The database 10 receives and records the inclination amount of the optical axis and the correction amount of alignment correction. In response to access from the monitoring tool 20, the database 10 transmits the inclination amount and the correction amount in conjunction with the identification information of the subject wafer to the monitoring tool 20.

In the above embodiment, the database 10, the monitoring tool 20, and the exposure apparatuses 1 to 3 are separately provided. For instance, they can transmit and receive data through a communication network. By such a configuration, a plurality of exposure apparatuses can be collectively controlled.

As an alternative embodiment of the system, the exposure apparatus can include the database 10 and the monitoring tool 20 so as to be independently controlled. In this case, the database 10 stores the inclination amount of the exposure optical system and the correction amount of alignment correction in that exposure apparatus.

Figure 2:
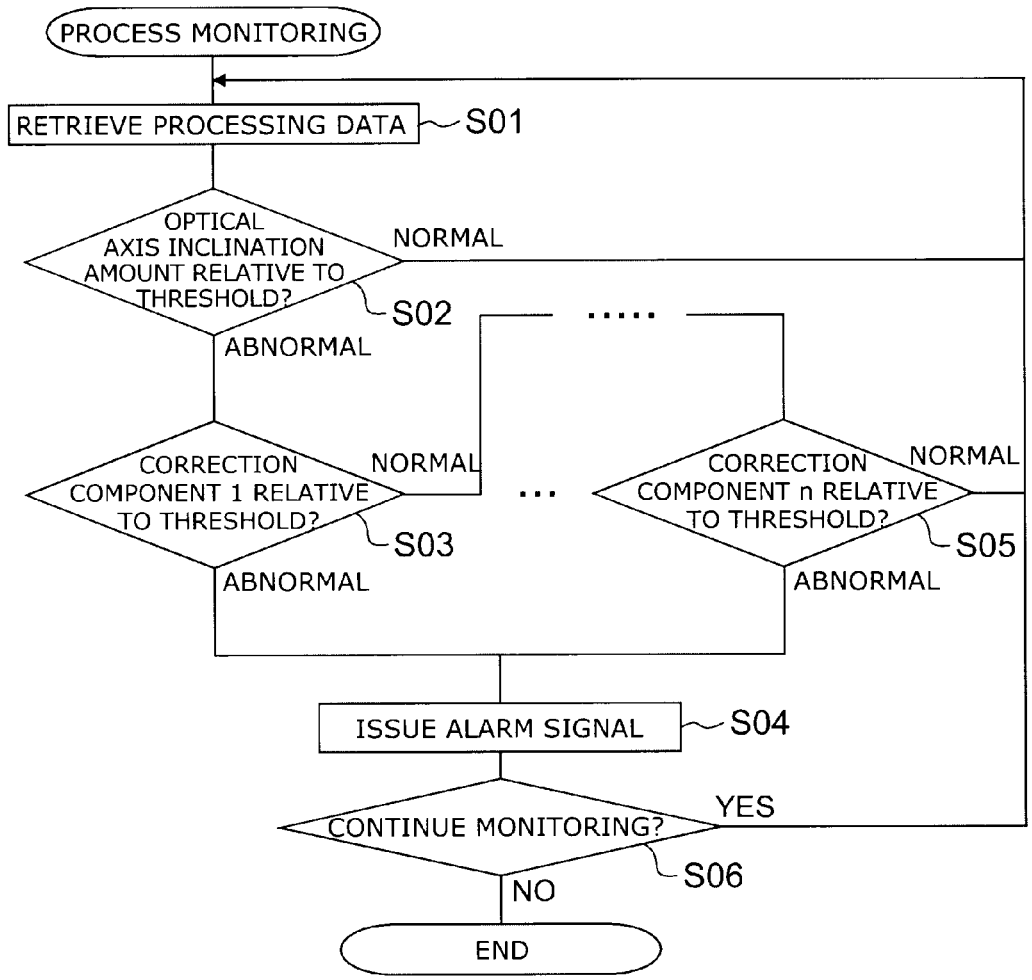
FIG. 2 is a flow chart illustrating a processing flow in a control method for the exposure apparatus according to the embodiment.

Next, with reference to the flow chart shown in FIG. 2, an exposure apparatus control method in the control system 100 is described.

The exposure apparatus control method according to the embodiment includes the step of retrieving from the database 10 the correction amount of alignment correction at the time of exposure of a wafer and the inclination amount of the optical axis of the exposure optical system with respect to the wafer stage at that exposure time (S01), the step of making a determination on the inclination amount and the correction amount based on a predetermined condition (S02, S03), and the step of issuing an alarm when the inclination amount and the correction amount both satisfy the predetermined condition (S04).

As shown in FIG. 2, the monitoring tool 20 retrieves the inclination amount of the optical axis and the correction amount of alignment correction as processing data from the database 10 (S01).

Subsequently, by comparing the inclination amount of the optical axis with the predetermined condition, it is determined whether the inclination amount lies within the normal range or has an abnormal value (S02). As described later, the predetermined condition can include a control value (e.g., threshold) determined based on the correlation between the failure rate in the product inspection and the inclination amount of the optical axis.

For instance, the inclination amount of the optical axis can be determined as normal when it is smaller than the preset threshold. The inclination amount of the optical axis can be determined as abnormal when it exceeds the threshold.

Alternatively, the inclination amount may be determined as abnormal when the variation between the inclination amount to be determined and the inclination amount of the optical axis in the immediately preceding exposure processing exceeds a prescribed value. Furthermore, the condition can also be based on whether the inclination amount of the optical axis has varied in the increasing direction, or conversely in the decreasing direction.

The inclination amount of the optical axis of the exposure optical system can be determined using the absolute value of the deviation with respect to a preset axis. Furthermore, for instance, the deviation of the optical axis may be projected onto X-Y coordinates on the major surface of the wafer stage and determined using a vector amount including the inclination direction.

If the monitoring tool 20 determines that the inclination amount of the optical axis retrieved in step 1 (S01) is normal, the monitoring tool 20 returns to step 1 and retrieves the next data from the database 10.

On the other hand, if the monitoring tool 20 determines that the inclination amount of the optical axis is abnormal, the monitoring tool 20 proceeds to the next step and makes a determination on the correction amount of alignment correction (S03).

The component of alignment correction to be determined can be the component extracted based on the failure rate in the product inspection. For instance, at least one or more items can be selected from the X-direction component, Y-direction component, rotational component, orthogonal component, scale component, and shift component in the major surface of the wafer stage.

For each selected component of alignment correction, the correlation between e.g. the failure rate in the product inspection and the correction amount is analyzed to determine a control value. The selected component of alignment correction and the control value are set as a predetermined condition in the monitoring tool 20. For instance, they may be previously inputted and set by the administrator.

The control value can be determined as the aforementioned threshold, or as an allowable range of the correction amount. Furthermore, the control value can be set for the relative variation of the correction amount.

In the case where the number of preset components of alignment correction is one, if the monitoring tool 20 determines that the correction amount retrieved in step 1 is normal based on the predetermined condition (control value), then the monitoring tool 20 returns to step 1 and retrieves the next data.

On the other hand, if the monitoring tool 20 determines the correction amount as abnormal, the monitoring tool 20 proceeds to the next step and issues an alarm signal (S04). For instance, an alarm image may be displayed on the display screen of the monitoring tool 20. Alternatively, an electronic mail may be sent to the administrator.

In the case where a plurality of components of alignment correction are set, the monitoring tool 20 makes a determination based on a logical sum such that if the monitoring tool 20 determines that the first correction component read in step 1 is normal, then the monitoring tool 20 proceeds to the determination of the next component of alignment correction, and so forth (S05). If all the components of alignment correction are normal, the monitoring tool 20 returns to step 1 and retrieves the next data from the database 10 (S06).

On the other hand, if the correction amount is determined as abnormal in any of the components of alignment correction, the monitoring tool 20 proceeds to step 4 and issues an alarm signal (S04).

Furthermore, in the case of continuing to monitor the inclination amount of the optical axis and the alignment correction, the monitoring tool 20 returns to step 1 and retrieves the next data from the database 10. On the other hand, if it is configured to stop monitoring, monitoring is ended (S07).

Figure 3:
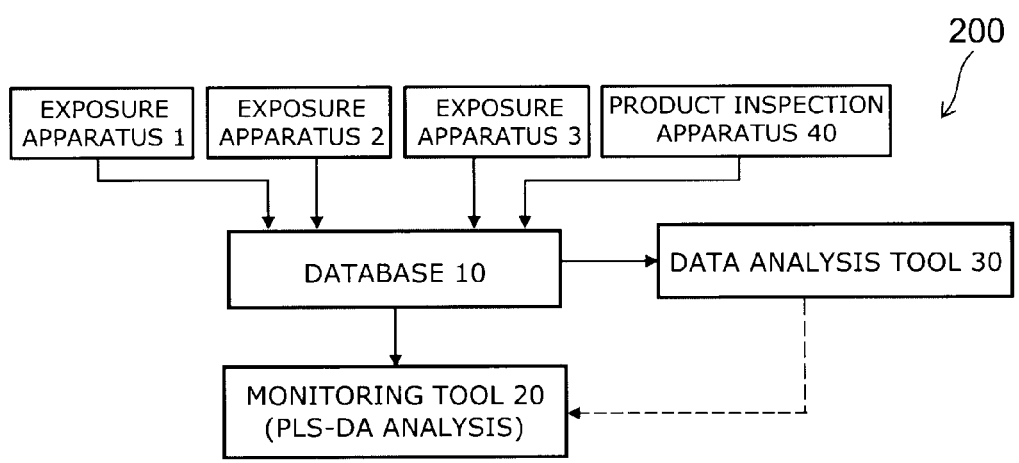
FIG. 3 is a block diagram illustrating a data analysis system according to the embodiment.
Figure 4:
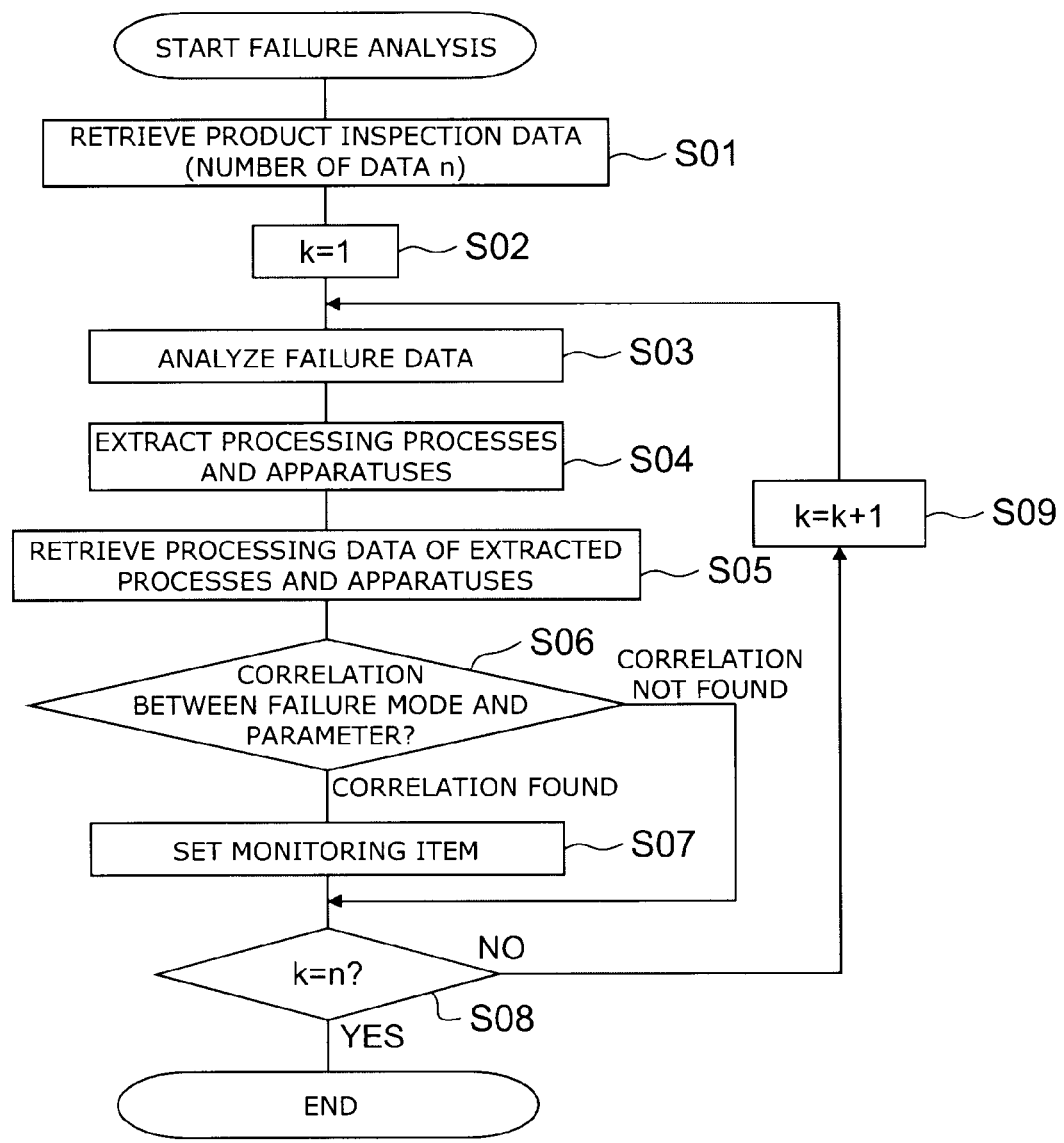
FIG. 4 is a flow chart illustrating the processing flow of the data analysis system according to the embodiment.

Next, with reference to FIGS. 3 and 4, selection of the component of alignment correction and a method for setting a control value are described.

FIG. 3 is a block diagram illustrating a data analysis system 200 according to the embodiment. The data analysis system 200 includes e.g. a database 10, a data analysis tool 30, and a monitoring tool 20. The database 10 stores processing data of exposure apparatuses 1 to 3 and a product inspection apparatus 40.

In the data analysis system 200 illustrated in the embodiment, the database 10 and the monitoring tool 20 are the same as those in the aforementioned exposure apparatus control system 100. However, the data analysis system 200 may be configured to include a database different from the database 10, and a data analysis terminal different from the monitoring tool 20. The data analysis tool 30 can be e.g. a terminal loaded with a data analysis program.

The database 10 can record processing data transmitted from the exposure apparatuses 1 to 3, and product inspection data transmitted from the product inspection apparatus 40. Furthermore, the database 10 can also record processing data from manufacturing apparatuses other than the exposure apparatuses.

For instance, when the exposure processing by the exposure apparatuses 1 to 3 is ended, processing data such as the optical axis inclination, the correction amount of alignment correction, the dose amount, the focus, and the synchronization accuracy are recorded in the database 10. Furthermore, data such as the failure rate in the product inspection process are also recorded in the database 10.

The monitoring tool 20 is loaded with e.g. a program for PLS-DA (partial least square discriminant analysis). The monitoring tool 20 can retrieve and statistically process the processing data stored in the database 10.

The database 10, the monitoring tool 20, and the data analysis tool 30 are connected through e.g. a communication network. The data analysis tool 30 accesses the database 10 to retrieve product inspection data. Then, for instance, the data analysis tool 30 performs classification of failure category and map pattern classification of the subject wafer. Thus, the data analysis tool 30 extracts apparatuses and processing process in which quality trouble has occurred.

From the data analysis tool 30, the monitoring tool 20 retrieves information of processing process and apparatuses which have caused the occurrence of quality trouble such as property failures. Furthermore, the monitoring tool 20 identifies the exposure apparatus related to the quality trouble. Then, from the database 10, the monitoring tool 20 retrieves data of the inclination amount of the optical axis of the exposure optical system and the correction amount of alignment correction in the process of processing the wafer subjected to the quality trouble. Subsequently, the monitoring tool 20 performs PLS-DA analysis to extract alignment correction items related to the quality trouble. Thus, the monitoring tool 20 can determine the control value of the items.

FIG. 4 is a flow chart illustrating the processing flow of the data analysis system 200.

For instance, in the case where quality trouble has occurred in the product inspection process, the administrator can operate the monitoring tool 20 and the data analysis tool 30 to perform the following process.

First, the data analysis tool 30 automatically retrieves product inspection data related to the quality trouble from the database 10 (S01).

Next, the first failure item is selected (S02: k=1). Subsequently, analysis of failure data is performed (S03). For instance, classification of failure category and map pattern classification of the defective wafer are performed to extract processing processes and apparatuses subjected to the quality trouble.

From the database 10, the monitoring tool 20 retrieves processing data of the apparatuses and processing processes extracted by the data analysis tool 30 (S05).

Subsequently, PLS-DA is used to analyze the processing data. Thus, correlation between the failure mode associated with the quality trouble and the processing data is determined (S06).

If a strong correlation is found between the failure mode and the processing data, a parameter related to the processing data is identified, and a control value is determined based on the correlation. Then, the identified parameter and the control value are set to a monitoring item of the monitoring tool 20 (S07). Then, the flow proceeds to the next step (S08).

On the other hand, if no correlation is found between the failure mode and the processing data, the flow proceeds to step 8. In step 8 (S08), it is determined whether the failure data analyzed in step 3 is the last failure data (k=n). If it is the last failure data, the failure analysis is ended. If it is not the last failure data, the flow proceeds to analysis of the next failure data (S09).

FIGS. 5A to 5D are graphs illustrating the temporal variation of parameters in the processing processes which is found by the data analysis system 200 to be correlated with the failure mode. On the horizontal axis, the exposure processing numbers are taken.

FIG. 5A shows the variation of the inclination amount of the optical axis of the exposure system in the order of the exposure processing. FIGS. 5B and 5C show the variation of the correction amount of alignment correction A (correction component A) and alignment correction B (correction component B) in the order of the exposure processing. FIG. 5D shows the variation of the failure rate of program failures of semiconductor memory devices in the wafer corresponding to the exposure processing.

As seen from comparison between FIGS. 5A and 5D, at the processing times J and L when the inclination amount of the optical axis increases, the failure rate of program failures begins to increase. Furthermore, at the processing times K and M when the inclination amount of the optical axis decreases, the failure rate begins to decrease. That is, in this example, it is found that data program failures occur corresponding to the inclination amount of the optical axis of the exposure system.

Furthermore, in view of the occurrence times J and L of data program failures, it is found that the variation of the correction amount of alignment correction A shown in FIG. 5B is large.

On the other hand, it is found that the correction amount of alignment correction B shown in FIG. 5C changes at the time L.

In the above example, the failure rate of program failures corresponds to the variation of the inclination amount of the optical axis of the exposure optical system. It is thus found that by monitoring the inclination amount of the optical axis, abnormalities causing program failures can be detected.

Furthermore, the variation of the correction amount of alignment correction A corresponds to the occurrence of program failures at J and L, and the variation of the correction amount of alignment correction B corresponds to the occurrence of program failures at L.

Hence, by monitoring the inclination amount of the optical axis in combination with the correction amount of alignment corrections A and B, abnormalities causing program failures can be reliably detected without error.

The inclination amount of the optical axis shown in FIG. 5A can be determined as an abnormality potentially causing program failures if it exhibits a variation equal to or greater than a prescribed value in the increasing direction of the inclination amount. For instance, in FIG. 5A, a value capable of distinguishing the variation at the times J and L from small variations at times other than J, K, L, and M can be set as a threshold.

The correction amount of alignment corrections A, B shown in FIGS. 5B and 5C can be determined as abnormal if the variation of the correction amount is larger than a prescribed value. Also in this case, for instance, a value capable of distinguishing the variation of the correction amount at the times J and L in FIG. 5B from other small variations can be set as a threshold.

Furthermore, as a reference to derive the variation of the inclination amount of the optical axis and the correction amount at the times J and L in FIGS. 5A and 5B, the average value of inclination amounts and the average value of correction amounts in a plurality of iterations of exposure processing before J and L can be used.

Based on this example, control by the control system 100 was performed on a plurality of exposure apparatuses A-H. TABLE 1 shows the result of operating the control system 100 for approximately eight months.

The control system 100 was configured to issue an alarm signal when the inclination of the optical axis of the exposure optical system exhibits an increase equal to or greater than a prescribed variation. Furthermore, the control system 100 was configured to issue an alarm signal when any of the correction amounts of a plurality of alignment correction items exhibits a variation exceeding a prescribed variation.

example of FIGS. 5A to 5D, the variation of the inclination of the optical axis corresponds to the occurrence and decrease of contact failures.

For instance, in the graph showing the progression of the contact failure rate shown in FIG. 6C, the occurrence of contact failures is found at the time J. On the other hand, the inclination of the optical axis shown in FIG. 6A is changed at the time J from the positive side to the negative side. Furthermore, the inclination amount on the negative side is larger than the inclination amount on the positive side. Consequently, the inclination amount of the optical axis exhibits an increasing change.

On the other hand, also at the time L in FIG. 6C, the contact failure rate increases, and the inclination of the optical axis in FIG. 6A increases to the positive side.

That is, also in the example, like the example of FIGS. 5A to 5D, the increasing change of the inclination of the optical axis corresponds to the occurrence of contact failures. The decrease of contact failures at the times K and M of FIG. 6C corresponds to the decrease of the inclination amount of the optical axis.

Furthermore, the variation of the correction amount of alignment correction A shown in FIG. 6B corresponds to the occurrence of contact failures at the times J and L, and the decrease of the contact failure rate at the time K.

Based on the example, in a process different from the example shown in FIGS. 5A to 5D, control using the control system 100 was performed on one exposure apparatus for approximately one year and two months.

As described above, the monitoring tool 20 was configured to issue an alarm signal when the inclination amount of the optical axis of the exposure optical system exhibits an increase exceeding a prescribed variation. Furthermore, the monitoring tool 20 was configured to issue an alarm signal when any of the correction amounts of a plurality of alignment correction items exhibits a variation exceeding a prescribed amount.

The result was that during the operating time of the control system 100 over approximately one year and two months, two

TABLE 1

| | Apparatus A | Apparatus B | Apparatus C | Apparatus D | Apparatus E | Apparatus F | Apparatus G | Apparatus I | Total | Hit rate |
|---|---|---|---|---|---|---|---|---|---|---|
| Quality trouble | 4 | 0 | 2 | 1 | 2 | 0 | 2 | 0 | 11 | 84.6% |
| False alarm | 0 | 1 | 0 | 1 | 0 | 0 | 0 | 0 | 2 | |

As shown in TABLE 1, the monitoring tool 20 issued 13 alarms. Of these alarms, the number of abnormalities leading to quality trouble was 11, and two of them were false alarms. That is, the hit rate of successfully alarming abnormalities causing quality trouble was 84.6%. Thus, it was confirmed that the exposure apparatus control system 100 according to the embodiment can detect quality trouble with high probability.

FIGS. 6A to 6C are graphs showing an example of another processing process which is found by the data analysis system 200 to be correlated with the failure mode. The example represents the relationship between contact failures of semiconductor memory devices on one hand and the inclination of the optical axis of the exposure optical system and the correction amount of alignment correction A on the other.

The inclination of the optical axis shown in FIG. 6A represents the amount of the inclination of the optical axis of the exposure optical system projected onto one direction, such as X-direction, on the wafer stage. Like the aforementioned alarms were issued, and all of them were abnormalities related to quality trouble. That is, the hit rate of abnormality detection was 100%. Thus, contact failures were successfully detected with high probability.

As described above, in the exposure apparatus control method and the control system performing the method according to the embodiment, abnormalities leading to quality trouble can be detected in real time. Furthermore, the embodiment can prevent the occurrence of heavy losses due to production of a large number of wafers including quality failures.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A control method for an exposure apparatus, comprising:
    retrieving, from a database, an inclination amount of a wafer stage with respect to an optical axis of an exposure optical system at the time of exposure, and a correction amount for correcting a deviation from an aligned position between a pattern provided on a wafer and an exposure pattern;
    determining whether the inclination amount satisfies a first predetermined condition or not;
    determining whether the correction amount satisfies a second predetermined condition or not; and
    issuing an alarm only when both the inclination amount satisfies the first predetermined condition and the correction amount satisfies the second predetermined condition.

2. The method according to claim 1, further comprising:
    converting data retrieved from the database to at least one of the inclination amount and the correction amount.

3. The method according to claim 1, wherein the first predetermined condition includes a control value based on a correlation between a failure rate in product inspection and an inclination amount of the wafer stage.

4. The method according to claim 1, wherein the second predetermined condition includes another control value based on a correlation between a failure rate in product inspection and a correction amount for correcting a deviation from an aligned position between a pattern provided on a wafer and an exposure pattern.

5. The method according to claim 1, wherein each of the first and second predetermined conditions includes one of a threshold and an allowable range.

6. The method according to claim 5, wherein the first and second predetermined conditions are satisfied when the inclination amount and the correction amount are abnormal values with reference to the one of the threshold and the allowable range.

7. The method according to claim 1, wherein the correction amount and the inclination amount for each wafer are retrieved, and each determination is made on the basis of wafer-to-wafer variation of the correction amount and the inclination amount.

8. The method according to claim 1, wherein the inclination amount is a vector amount of deviation of the optical axis projected onto a major surface of the wafer stage.

9. The method according to claim 1, wherein the first predetermined condition is satisfied when the inclination amount has varied wafer-to-wafer in an increasing direction.

10. The method according to claim 1, wherein the correction amount is an amount of deviation between a pattern formed on the wafer and an exposure pattern.

11. The method according to claim 10, wherein the correction amount is determined as the amount of deviation with reference to an alignment mark provided on the wafer.

12. The method according to claim 1, wherein the correction amount includes different components, each component is subjected to the determination based on another predetermined condition provided therefor, and the second predetermined condition is satisfied when the other condition is satisfied for at least one of the different components.

13. The method according to claim 1, wherein the deviation includes at least one, in a major surface of the wafer stage, of an X-direction component, a Y-direction component, a rotational component, an orthogonal component, components due to a different scale, and a shift of exposure shot.

14. The method according to claim 1, wherein the deviation includes at least one of a linear component and a nonlinear component in a major surface of the wafer stage.

15. A control system for an exposure apparatus, comprising:
    a database storing a correction amount for correcting a deviation from an aligned position between a pattern provided on a wafer and an exposure pattern at a time of exposure, and an inclination amount of a wafer stage with respect to an optical axis of an exposure optical system at the time of exposure; and
    a control section configured to read the correction amount and the inclination amount from the database, to determine whether the inclination amount satisfies a first predetermined condition or not, and whether the correction amount satisfies a second predetermined condition or not, and to issue an alarm only when both the inclination amount satisfies the first predetermined only when both the correction amount satisfies the second condition.

16. The system according to claim 15, wherein the database and the control section transmit and receive data through a communication network.

17. The system according to claim 15, wherein the database and the control section are incorporated in an exposure apparatus.

18. The system according to claim 15, wherein the database stores product inspection data that are used for determining the first and second predetermined conditions.

19. The system according to claim 18, further comprising:
    a data analysis terminal configured to retrieve the product inspection data and to extract quality trouble in the product inspection data.

20. The system according to claim 15, further comprising other databases, and the control section reads the correction amount and the inclination amount from one of the databases.

* * * * *